(12) United States Patent
Sugiura et al.

(10) Patent No.: US 8,586,872 B2
(45) Date of Patent: Nov. 19, 2013

(54) METAL CORE SUBSTRATE

(75) Inventors: Tomohiro Sugiura, Makinohara (JP); Akira Harao, Makinohara (JP); Minoru Kubota, Makinohara (JP)

(73) Assignee: Yazaki Corporation, Tokyo (JP)

( * ) Notice: Subject to any disclaimer, the term of this patent is extended or adjusted under 35 U.S.C. 154(b) by 62 days.

(21) Appl. No.: 13/229,786

(22) Filed: Sep. 12, 2011

(65) Prior Publication Data

US 2012/0090881 A1    Apr. 19, 2012

(30) Foreign Application Priority Data

Oct. 13, 2010   (JP) .................................. 2010-230733

(51) Int. Cl.
*H05K 1/09* (2006.01)
*H05K 1/00* (2006.01)

(52) U.S. Cl.
USPC ........... 174/257; 174/252; 174/261; 361/749; 361/794

(58) Field of Classification Search
USPC ......... 174/254, 255, 257, 258, 261, 252, 256, 174/268; 361/736, 748, 749, 751, 789, 794
See application file for complete search history.

(56) References Cited

U.S. PATENT DOCUMENTS

| 4,338,149 | A | * | 7/1982 | Quaschner | ...................... | 156/248 |
| 4,687,695 | A | * | 8/1987 | Hamby | .......................... | 428/192 |
| 5,615,088 | A | * | 3/1997 | Mizumo | ........................ | 361/749 |
| 6,288,343 | B1 | * | 9/2001 | Ahn et al. | ...................... | 174/254 |

FOREIGN PATENT DOCUMENTS

JP          11-41752 A     2/1999

* cited by examiner

*Primary Examiner* — Hoa C Nguyen
(74) *Attorney, Agent, or Firm* — Sughrue Mion, PLLC

(57) ABSTRACT

A metal core substrate is provided. A first routing member is comprised of a first area of one sheet of metal core material; a first insulation layer formed on the first area; and a first circuit pattern made of a copper foil and formed on the first insulation layer. A second routing member comprised of: a second area of the one sheet of the metal core material, which is separated from the first area; a second insulation layer formed on the second area; and a second circuit pattern made of a copper foil and formed on the second insulation layer. A connecting member electrically connects the first routing member and the second routing member. The connecting member is comprised of a third area of the one sheet of the metal core material, which is interposed between the first area and the second area.

7 Claims, 7 Drawing Sheets

METAL CORE SUBSTRATE

BACKGROUND

The present invention relates to a metal core substrate, and more particularly, to an electrical connection between routing members accommodated in a power supply box having an unordinary polyhedral shape which is bent at a right angle, rather than a power supply box having an ordinary planar shape.

Example of Routing Member According to Related Art

FIG. 7 is a cross sectional view illustrating an example of a routing member 80 according to the related art.

In the routing member 80, conductive circuit patterns 82 are formed on upper and lower surfaces of an insulating substrate 81. The insulating substrate 81 is mounted with a semiconductor switching device (heat generating device) TR for switching and controlling load, a driving member DR for driving the semiconductor switching device TR, a heat radiation fin F for the semiconductor switching device TR and a connector C. The routing member 80 is supplied with power from a vehicle-mounted battery through a connection terminal T2 of a counterpart connector 30K and a connection terminal T1 of the connector C of the routing member 80. The routing member 80 converts the power into desired power by supplying the power to the load off and on, based on the switching control of the semiconductor switching device TR.

Electrical Connection of Routing Members Accommodated in Power Supply Box Having Unordinary Shape When the two routing members 80 shown in FIG. 7 are mounted to a planar power supply box, there is no particular problem regarding the supply of power supply energy. However, regarding a case where it is required to form a power supply box 20 into an unordinary polyhedral shape which is bent at a right angle due to vehicle mount requirements, as shown in FIG. 8, when routing members 100, 110 are accommodated in the power supply box 20, a problem is caused regarding the supply of the power supply energy to the downstream routing member 110.

Accordingly, in order to electrically connect the routing members positioned at the different sides, it is necessary to provide branches on a wire harness and to separately connect the branches to the routing members, as shown in FIG. 8, or to use a component such as connector, as shown in FIG. 9.

Branch Connection

FIG. 8 is a perspective view illustrating a method of supplying power supply energy according to the related art 1, in which branches are provided on the wire harness and are separately connected to the routing members 100, 110. In FIG. 8, when the routing members 100, 110 such as routing member 80 shown in FIG. 7 are respectively accommodated in the power supply box 20 whose routing member accommodating space is bent at a right angle, an upstream wire harness main line 30, in which a power supply line and an input/output lines are incorporated, is connected to the routing member 100 through a connector 10K. In addition, a downstream wire harness main line 40, in which input/output lines 40B are incorporated, is connected to the routing member 110 through a connector 11K. In order to supply the power supply energy to the routing member 110, the upstream wire harness main line 30 is provided with a branch line 31, so that a circuit connection is made from the branch line 31 through the connector 110K.

Defects of Branch Connection

However, in recent years, it is difficult to secure the mount space of the wire harness or the power supply box, the pressing need is to reduce the number of parts, and the upstream circuit requires a high current specification in the power supply box. Accordingly, it is difficult to branch a thick electric wire by using the above branch connection.

Connector Connection

FIG. 9 is a perspective view illustrating a method of supplying power supply energy according to the related art 2, in which the routing members 100, 110 positioned at different sides are electrically connected by connectors K1, K2. In FIG. 9, when the routing members 100, 110 such as routing member 80 shown in FIG. 7 are respectively accommodated in the power supply box 20 whose routing member accommodating space is bent at a right angle, the upstream wire harness main line 30, in which the power supply line and the input/output lines are incorporated, is connected to the routing member 100 through the connector 10K. In addition, the downstream wire harness main line 40, in which the input/output lines are incorporated, is connected to the routing member 110 through the connector 11K. In order to supply the power supply energy to the routing member 110, a connector K1 and a counterpart connector K2 are respectively mounted to a rear end portion of the routing member 100 and a leading end portion of the routing member 110, so that the power supply energy is supplied to the routing member 110 from the routing member 100 through the connector K1 and the connector K2.

Defects of Connector Connection

The connector connection also has the same problems as the branch connection. In other words, in recent years, it is difficult to secure the mount position of the wire harness or the power supply box, the pressing need is to reduce the number of parts, and the upstream circuit requires a high current specification in the power supply box. Accordingly, it is difficult to set up a large-scaled connector by using the above connector connection.

Flexible Printed Substrate Connection

In addition, JP-A-11-41752 discloses that one end portion of a first flexible printed substrate is connected to a circuit substrate in a case of an electric connection box, the other end portion thereof is connected to a slot-in connector, the slot-in connector is attached to an opening of the case and thus a printed substrate is detachably inserted and connected from the outside of the case. When the configuration disclosed in JP-A-11-41752 is adopted, the flexible printed substrate having an excellent routing ability is used to connect the upstream routing member and the downstream routing member and the power supply energy may be supplied through the flexible printed substrate.

Defects of Flexible Printed Substrate Connection

The flexible printed substrate of JP-A-11-41752 has an effect in a small-capacity device. However, since the upstream circuit in the power supply box requires the high current specification, it is not possible to cope with the high current by using the flexible printed substrate.

SUMMARY

It is therefore an object of the present invention to provide a metal core substrate capable of reducing the number of parts and coping with a high current specification.

In order to achieve the above described object, according to an aspect of the present invention, there is provided a metal core substrate comprising: a first routing member comprised of: a first area of one sheet of metal core material; a first insulation layer formed on the first area; and a first circuit pattern made of a copper foil and formed on the first insulation layer; a second routing member comprised of: a second area of the one sheet of the metal core material, which is separated from the first area; a second insulation layer formed on the second area; and a second circuit pattern made of a copper foil and formed on the second insulation layer; and a connecting member which electrically connects the first routing member and the second routing member, the connecting member comprised of a third area of the one sheet of the metal core material, which is interposed between the first area and the second area.

The third area may be bent at a right angle or 180 degrees. The third area may be divided into a plurality of parts in a width direction of the metal core material.

According to the invention, since it is possible to use a common metal core material for two routing members as a power supplying path, it is possible to omit the component parts of the related art, such as a branch line and connectors and to cope with the high current specification. In addition, since the insulation layer and the copper foil are not formed on the third area of the one sheet of the metal core material, the metal core substrate can be bent at the third area and thus accommodated in the power supply box having an unordinary shape.

In addition, when the common metal core material for two routing members is divided into a plurality of parts in the width direction of the metal core material, it is possible to reduce the forming force at the time of bending processing and to cope with a case where a plurality of power supply systems is provided.

DETAILED DESCRIPTION OF THE EMBODIMENTS

Hereinafter, illustrative embodiments of the present invention will be described with reference to the accompanying drawings.

Metal Core Substrate According to First Illustrative Embodiment

Figure 1:
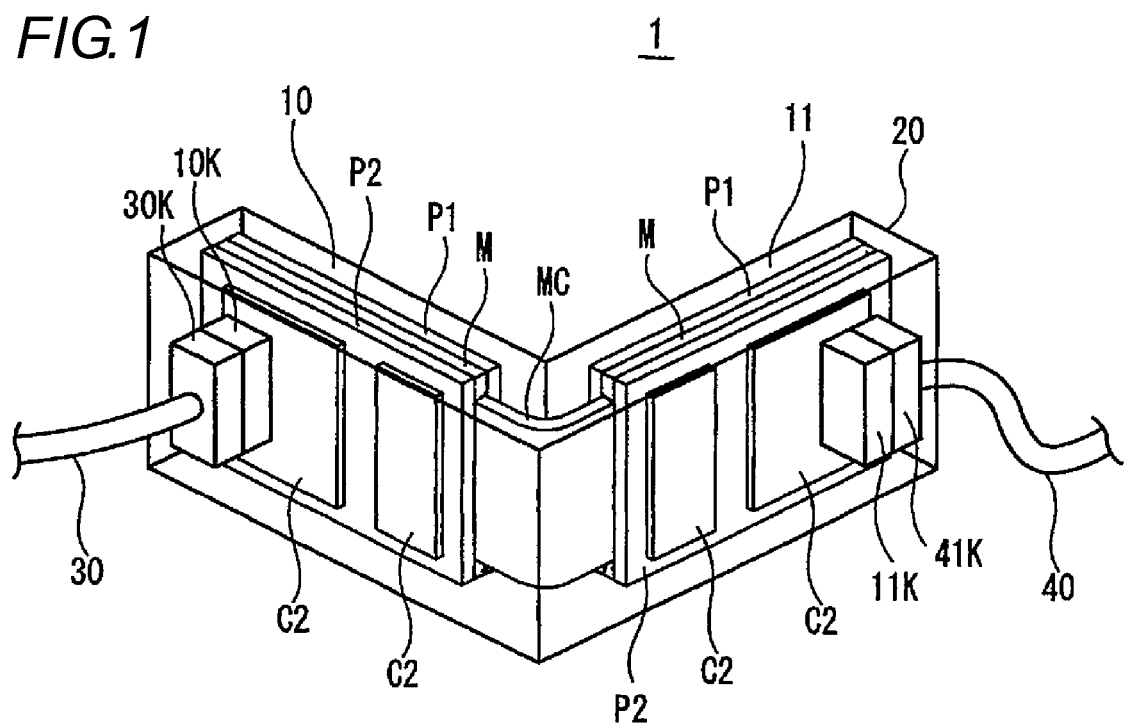
FIG. 1 is a perspective view illustrating a metal core substrate according to an illustrative embodiment of the present invention, in a state where routing members are accommodated in an power supply box having an unordinary shape which is bent at a right angle.

FIG. 1 is a perspective view showing a metal core substrate according to an illustrative embodiment of the present invention.

A metal core substrate 1 according to the illustrative embodiment of the present invention is configured so that routing members can be respectively accommodated in a power supply box having an unordinary shape. A routing member 10 and a routing member 11, which are mounted to a common metal core material M, are accommodated with being bent at a right angle in a power supply box 20 having an unordinary shape and a routing member accommodating space which is bent at a right angle, as shown in FIG. 1.

In FIG. 1, the reference numeral 1 indicates the metal core substrate having a plurality of routing members 10, 11 mounted thereto according to the illustrative embodiment of the present invention. A connector 30K of an upstream wire harness main line 30 in which a power supply line 30A (refer to FIG. 3A) and input/output lines 30B (refer to FIG. 3B) are incorporated is connected to a connector 10K of the routing member 10.

In addition, a connector 41K of a downstream wire harness main line 40 in which input/output lines 40B (refer to FIG. 3A) are incorporated is connected to a connector 11K of the routing member 11.

In order to supply power supply energy to the routing member 11, one sheet of metal core material M is commonly utilized for the upstream routing member 10 and the downstream routing member 11 as a power supplying path. The common metal core material M is bent at a center MC thereof at a right angle so that the routing members 10, 11 can be accommodated in the power supply box 20 having an unordinary shape which is bent at a right angle.

Like this, the one sheet of the metal core material M is used as the power supplying path and is bent depending on conditions.

Configuration of Routing Members 10, 11

Figure 2A:
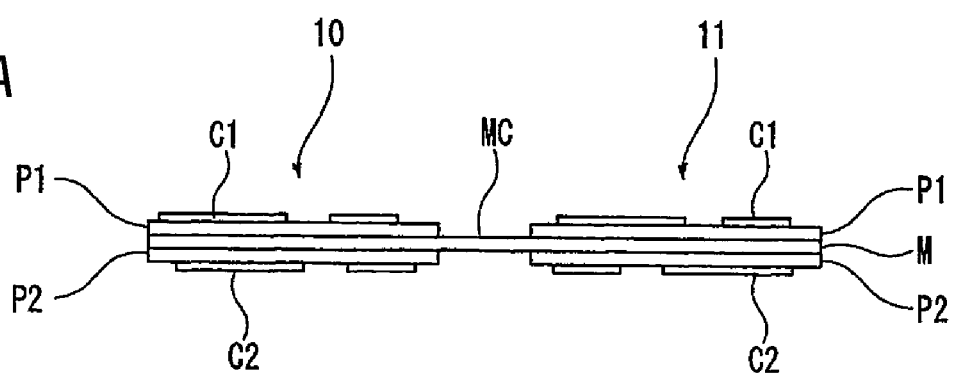
FIG. 2A is a front view illustrating a configuration of the routing members according to the illustrative embodiment of the present invention in a state before bending.
Figure 2B:
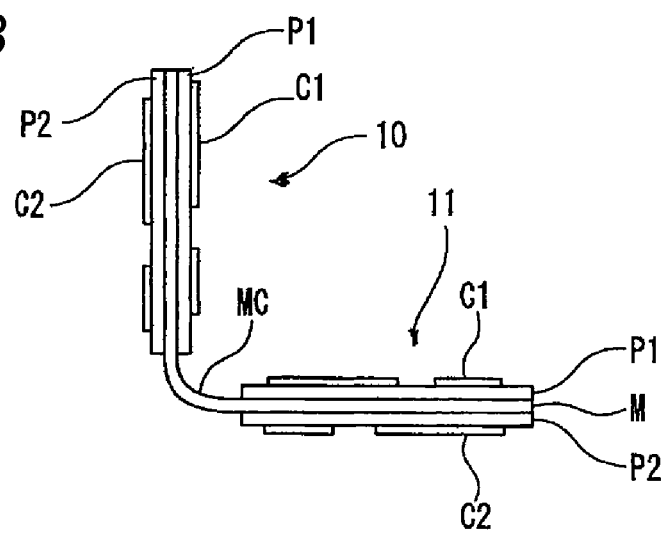
FIG. 2B is a front view illustrating a configuration of the routing members according to the illustrative embodiment of the present invention in a bent state.

FIG. 2A is a cross sectional view illustrating the configuration of the routing members 10, 11 in a state before bending and FIG. 2B is a cross sectional view illustrating the configuration of the routing members 10, 11 in a bent state. As shown in FIG. 2A, one sheet of the metal core material M which is made of a copper plate is provided. In the vicinity of the center in the left-right direction, the metal core material M is exposed. Insulation material (layers) P1 are formed on an upper surface of the metal core material M in a left side area (a first area) and a right side area (a second area) of the metal core material M. Insulation material (layers) P2 are formed on a lower surface of the metal core material M in the left side area (the first area) and the right side area (the second area) of the metal core material M. The right side area is separated from the left side area. That is, a center area (a third area) of the metal core material M is interposed between the right side area and the left side area. Copper foils C1 in which conductive patterns are formed are formed on the insulation material P1 and copper foils C2 in which conductive patterns are formed are formed on the insulation material P2. Electrical components are mounted on surfaces of the insulation materials P1, P2. The copper foils C1 which form circuit patterns on the insulation material P1 are electrically connected to the copper foils C2 which form circuit patterns on the insulation material P2 through a through-hole TH (refer to FIG. 5) whose inner periphery is plated, thereby forming an electric circuit.

In FIG. 2A, the routing member 10 is comprised of the left side area of the one sheet of the metal core material M, and the insulation materials P1, P2 and the copper foils C1, C2 formed thereon. The routing member 11 is comprised of the right side area of the one sheet of the metal core material M, and the insulation materials P1, P2 and the copper foils C1, C1 formed thereon. The insulation material P2 and the copper foils C2 may be omitted. The one sheet of the metal core material M is used not only as a heat radiation plate but also as the power supplying path for supplying the power supply energy from the routing member 10 to the routing member 11. That is, the center area of the metal core material M serves as a connecting member which electrically connects the routing member 10 and the routing member 11.

As shown in FIG. 2B, the center area of the metal core material M can be bent at a right angle to obtain the bent metal core substrate. Accordingly, the center area of the metal core material M is also referred to as a bending portion MC. Since the bent metal core substrate can be accommodated in the power supply box 20 having the routing member receiving space which is bent at the right angle, as shown in FIG. 1, the branch line shown in FIG. 8, the connectors K1, K2 shown in FIG. 9 and the flexible printed substrate disclosed in JP-A-11-41752 are not required. As a result, it is possible to reduce the number of parts, to improve the space efficiency, to miniaturize the power supply box and to cope with the high current specification.

Figure 3A:
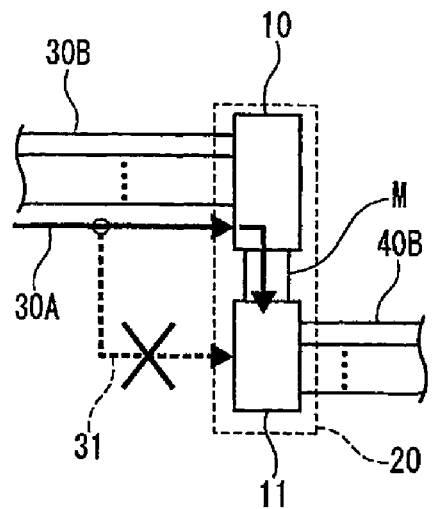
FIG. 3A is a circuit diagram illustrating an equivalent circuit for explaining a method of supplying power supply energy to the routing members using the metal core substrate shown in FIG. 1.
Figure 3B:
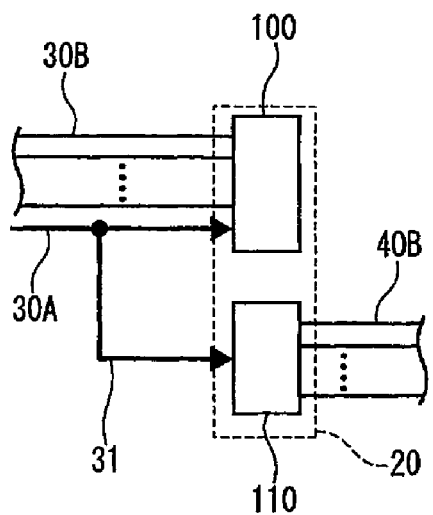
FIG. 3B is a circuit diagram illustrating an equivalent circuit for explaining a method of supplying power supply energy to the routing members using a branch connection method shown in FIG. 8.

FIG. 3A is a circuit diagram illustrating an equivalent circuit for explaining a method of supplying power supply energy to the routing members 10, 11 using the metal core substrate 1 shown in FIG. 1. FIG. 3B is a circuit diagram illustrating an equivalent circuit for explaining a method of supplying power supply energy to the routing members 100, 110 using the branch connection method shown in FIG. 8.

Figure 8:
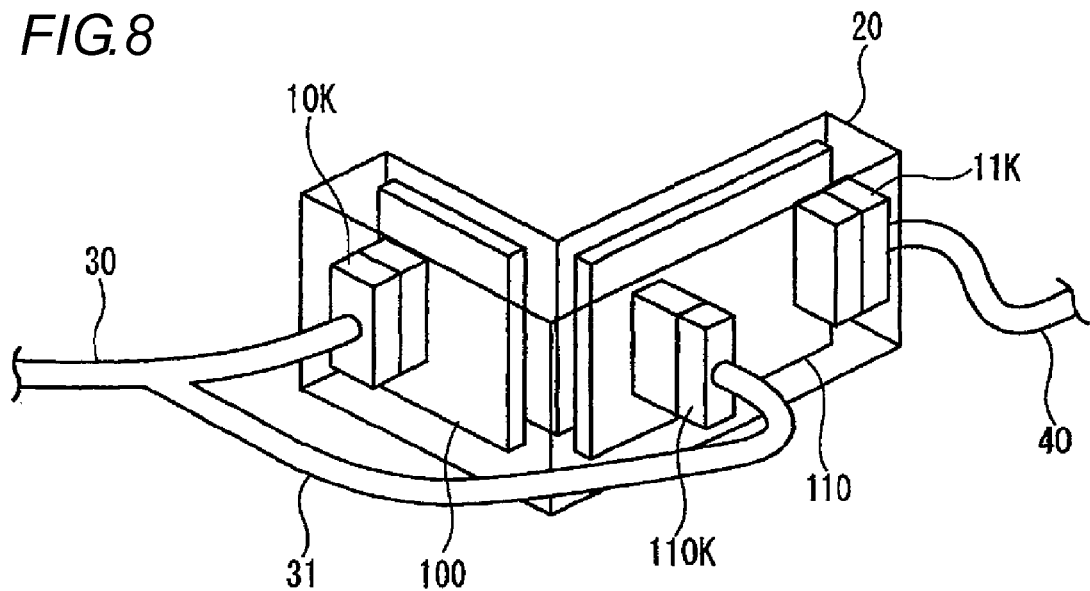
FIG. 8 is a perspective view illustrating a method of supplying power supply energy according to the related art 1.
Figure 9:
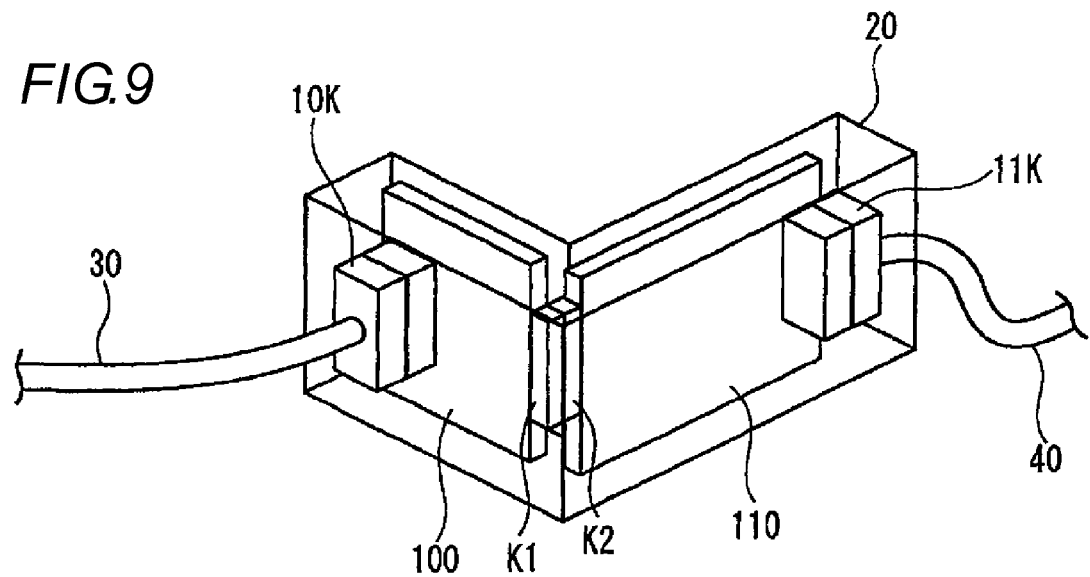
FIG. 9 is a perspective view illustrating a method of supplying power supply energy according to the related art 2.

In FIG. 3B, the upstream wire harness main line 30 (refer to FIG. 8), in which the power supply line 30A and the input/output lines 30B are incorporated, is connected to the routing member 100 through the connector 10K (refer to FIG. 8). In addition, the downstream wire harness main line 40 (refer to FIG. 8), in which the input/output lines 40B are incorporated, is connected to the routing member 110 through the connector 11K (refer to FIG. 8). The branch line 31 is provided on the power supply line 30A, thereby supplying the power supply energy to the routing member 110. Accordingly, the branch line 31 is necessarily required in the configuration shown in FIG. 3B.

In FIG. 3A, the upstream wire harness main line 30 (refer to FIG. 1), in which the power supply line 30A and the input/output lines 30B are incorporated, is connected to the routing member 10 through the connector 10K (refer to FIG. 1). In addition, the downstream wire harness main line 40 (refer to FIG. 1), in which the input/output lines 40B are incorporated, is connected to the routing member 11 through the connector 11K (refer to FIG. 1). In order to supply the power to the routing member 11, the routing member 10 and the routing member 11 are electrically connected by (the center area of) the metal core material M. At this time, the metal core material M serving as the heat radiation plate is also used as the power supplying path.

With the above configuration, since it is possible to omit the branch line 31 shown in FIG. 3B, it is possible to reduce the number of parts and to effectively secure the space.

Figure 4:
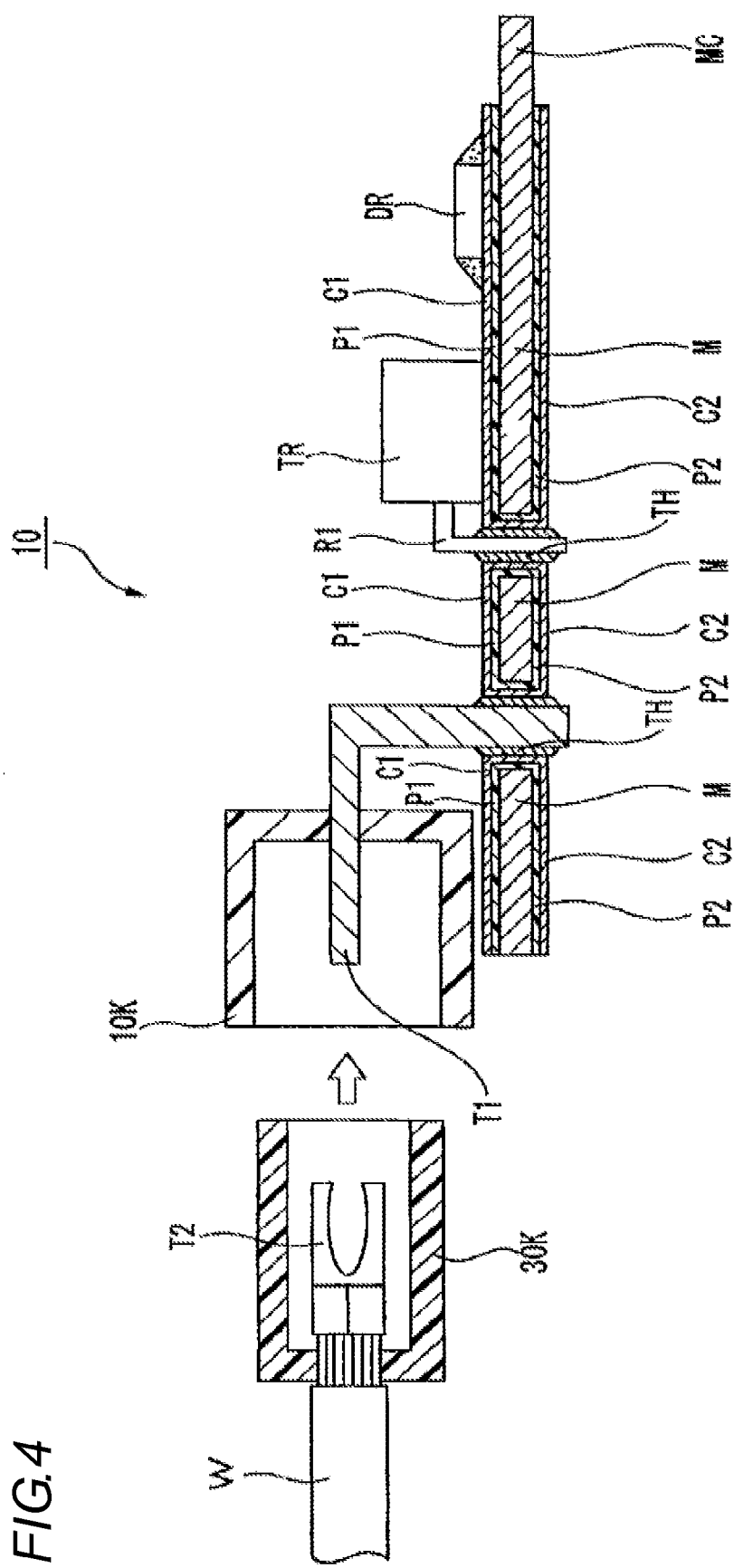
FIG. 4 is a cross sectional view illustrating an example of a routing member according to the illustrative embodiment of the present invention.

FIG. 4 is a cross sectional view illustrating an example of the routing member 10 having electric parts mounted thereto.

As shown in FIG. 4, the insulation materials P1, P2 are formed on, in layers, the upper and lower surfaces of one sheet of the metal core material M made of a copper plate. The copper foils C1, C2 forming conductive circuit patterns are stacked on the insulation layers and a semiconductor switching device TR for switching and controlling load and a driving part DR for driving the device are mounted on the copper foil C1. One end R1 of a terminal of the semiconductor switching device TR is connected to the opposite copper foil C2 forming the conductive circuit pattern through the through-hole TH. Also, the connector 10K that has a plurality of connection terminals T1 (in a direction perpendicular to the sheet) is mounted, and the connection terminals T1 are supplied with the power from a vehicle-mounted battery through connection terminals T2 of the counterpart connector 30K. The routing member 10 converts the power into desired power by supplying the power to the load off and on, based on the switching control of the semiconductor switching device TR. The metal core material M and the respective electronic components TR, DR, C1, C2 mounted thereof constitute the routing member 10, though some of them can be omitted. The counterpart connector 30K has a plurality of connection terminals T2 (in a direction perpendicular to the sheet) connected to a wire W, respectively. Since the wire W is electrically connected to the vehicle-mounted battery, and the loads such as a lamp and a motor which are mounted to the vehicle, the terminals T2 supply the power, which is supplied from the vehicle-mounted battery, to the terminals T1, and are supplied with the power from the terminals T1 so as to supply the power, which has been converted into the desired value based on the switching control of the semiconductor switching device TR, to the loads. The reference numeral MC indicates the bending portion of the metal core material M. The copper foils C1, C2 and the insulation materials P1, P2 are removed from the bending portion MC. Since the copper foil or insulation material is not provided to the bending portion MC, it is possible to bend the metal core material M at the bending portion MC without particular troublesome.

As shown in FIG. 4, the routing member 10 has the five-layered structure. However, a nine-layered structure may be also possible in which insulation materials P3, P4 are further stacked on the upper and lower surfaces of the routing member 10 and copper foils C3, C4 are further stacked thereon. As described above, three-layered structure may be also possible in which insulation material P2 and the copper foil C2 are omitted.

Metal Core Substrate According to Second Illustrative Embodiment

Figure 5:
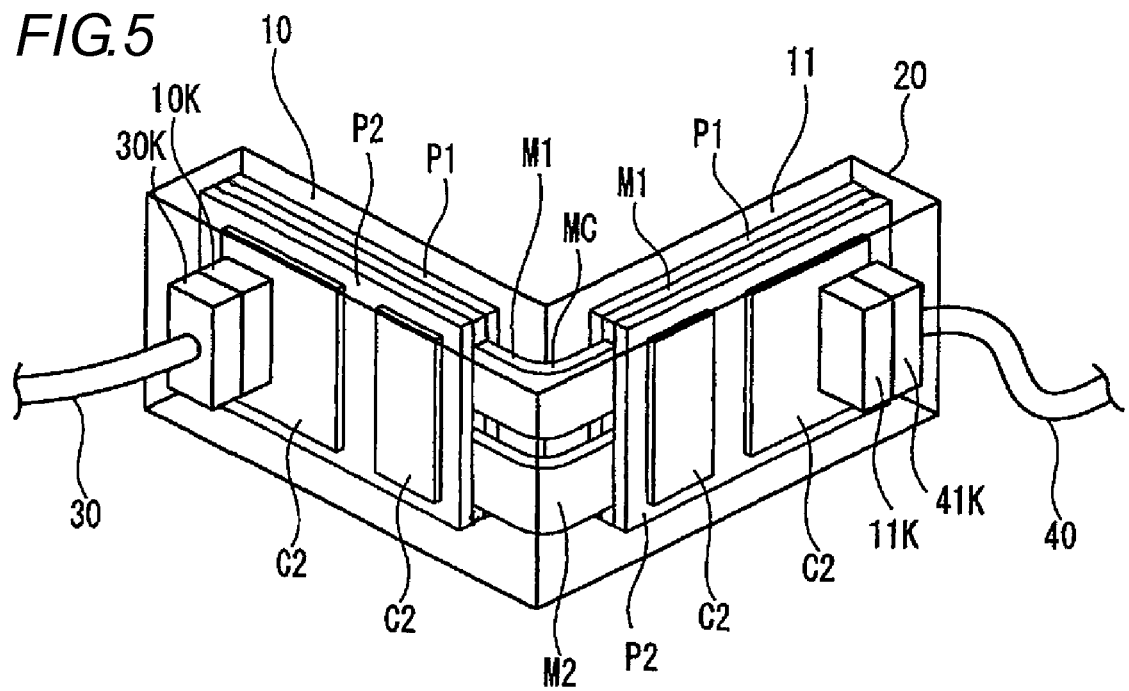
FIG. 5 is a perspective view illustrating a metal core substrate according to a second illustrative embodiment of the present invention.

FIG. 5 is a conceptual perspective view illustrating a metal core substrate according to a second illustrative embodiment of the present invention. The second illustrative embodiment shows another example of the bending portion. In the first illustrative embodiment, when the power supply box has the unordinary shape as shown in FIG. 1, the metal core material M is bent. In the vicinity of the bending portion MC, the insulation materials P1, P2 and the copper foils (the circuit patterns) C1, C2 are removed so that the metal core material M is exposed and the bending portion MC is bent at the right angle. However, the bending portion MC (i.e. the center area) of the metal core material M may be divided into a plurality of narrow parts M1, M2 in a width direction of the metal core material M, as shown in FIG. 5. This configuration can be employed when the bending portion MC is relatively large in width. With this configuration, it is possible to reduce the forming force at the time of bending processing of the metal core material M.

Metal Core Substrate According to Third Illustrative Embodiment

When two systems of the upstream circuits are provided, the metal core material M may be electrically divided into two circuits and the bending portion MC may also be divided into two or more narrow parts as shown in FIG. 5.

In addition, even when three or more systems of the upstream circuits are provided, it is possible to cope with the situation by the same solution.

Metal Core Substrate According to Fourth Illustrative Embodiment

In the first to third illustrative embodiments, the bending portion MC is bent at the right angle. In a fourth illustrative embodiment, however, the bending portion MC is bent at 180 degrees. In this configuration, a lower substrate is utilized as a power supply circuit and an upper substrate is utilized as a control circuit. The lower substrate and the upper substrate are electrically connected through the bending portion MC of the metal core material M, which is bent at 180 degrees to form a U-shape so that the present invention can be applied to a stack type of the metal core substrate.

Summarization (1) In the metal core substrate, the metal core layer is utilized as a common circuit.

(2) When the power supply box has the unordinary shape as shown in FIG. 1, the substrate is bent at the central bending portion MC as shown in FIG. 2B. At this time, in the vicinity of the bending portion MC, the insulation materials and the circuit patterns (the copper foils) are removed from the metal core material M so that the metal core material M is exposed as shown in FIGS. 2A and 2B.

(3) When the bending portion MC of the metal core material M is relatively large in width, the connecting member having a plurality of narrow parts M1, M2 may be partially formed, as shown in FIG. 5. Thereby, it is possible to reduce the forming force at the time of bending processing of the metal core material M.

(4) In addition, when two systems of the upstream circuit is provided, the metal core layer is electrically divided into two circuits and the bending portion MC is also divided into two or more narrow parts as shown in FIG. 5. Also, even when three or more systems of the upstream circuits are provided, it is possible to cope with the situation by the same solution.

Figure 6:
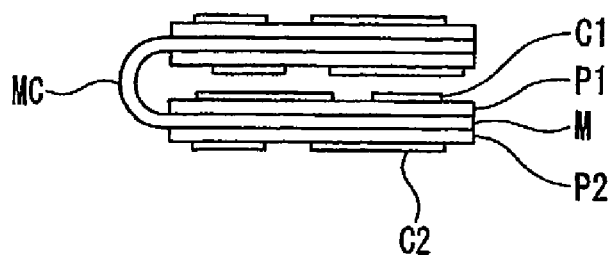
FIG. 6 is a front view illustrating a metal core substrate according to a third illustrative embodiment of the present invention.
Figure 7:
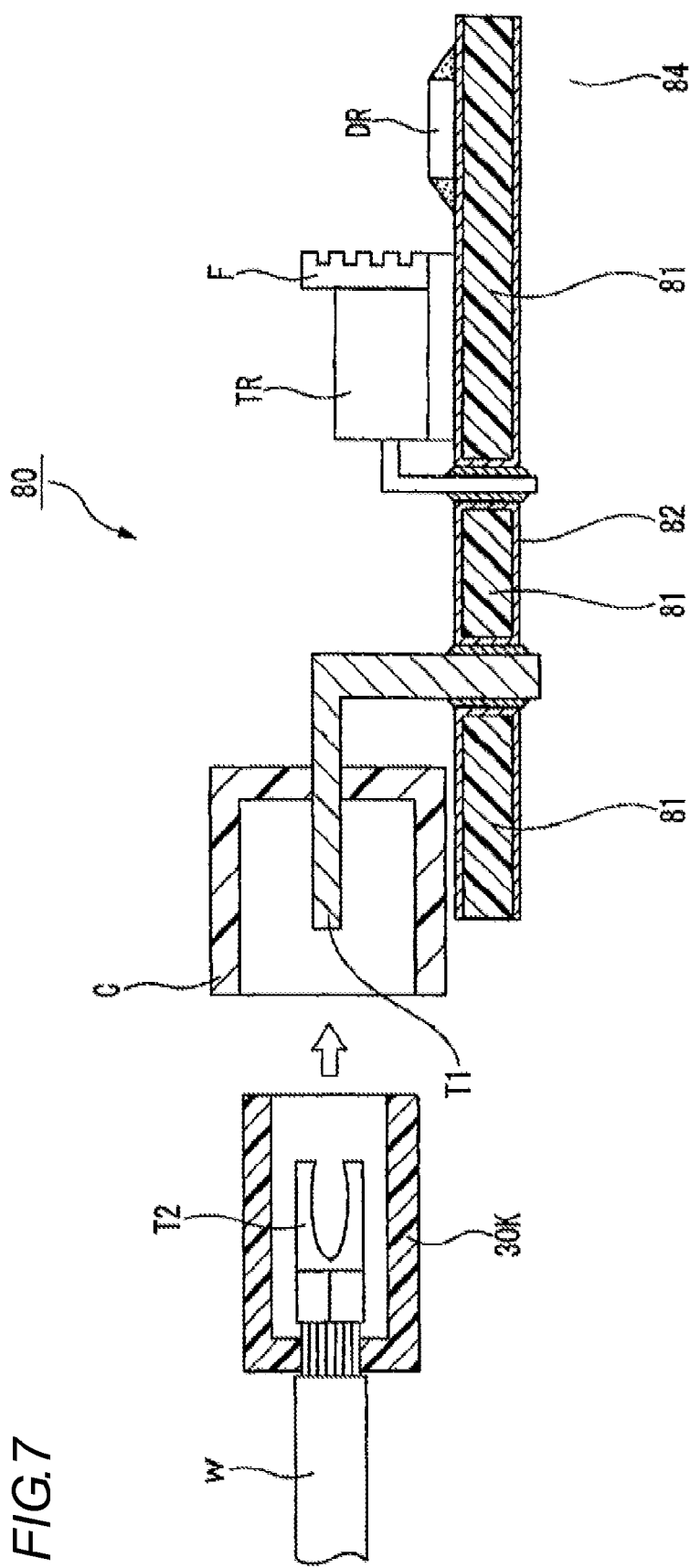
FIG. 7 is a cross sectional view illustrating an example of a routing member according to the related art.

(5) When a lower substrate is used as a power supply circuit and an upper substrate is used as a control circuit, the bending portion MC of the metal core material M is bent at 180 degrees as shown in FIG. 6.

With the above illustrative embodiments, it is possible to obtain following effects:

(a) As the routing members for the power supply box having the unordinary shape, a single metal core substrate can be used. Thus, it is possible to improve the routing ability.

(b) By using the metal core material as the power supply unit, it is possible to simply route the power supply circuit (the upstream circuit) in the power supply box. In addition, it is not necessary to provide a branch of the power supply line by the wire harness.

The invention claimed is:

1. A metal core substrate comprising:
a sheet of metal core material disposed in a power supply box;
a first routing member mounted to the sheet of metal core material, comprised of:
a first area of the sheet of metal core material;
a first insulation layer formed on the first area; and
a first circuit pattern made of a copper foil and formed on the first insulation layer;
a second routing member mounted to the sheet of metal core material, comprised of:
a second area of the sheet of the metal core material, which is separate from the first area;
a second insulation layer formed on the second area; and
a second circuit pattern made of a copper foil and formed on the second insulation layer; and
a connecting member which electrically connects the first routing member and the second routing member, the connecting member comprised of a third area of the sheet of the metal core material, which is interposed between the first area and the second area, wherein the third area is exposed and does not include an insulation layer formed thereon.

2. The metal core substrate according to claim 1, wherein the third area is bent at a right angle or 180 degrees.

3. The metal core substrate according to claim 2, wherein the third area is divided into a plurality of parts in a width direction of the metal core material.

4. The metal core substrate according to claim 1, wherein the sheet of metal core material consists of one sheet layer.

5. A metal core substrate of a power supply box, comprising:
a sheet of metal core material configured to serve a heat radiation plate and a power supply path in the power supply box;
a first routing area which includes a first portion of the metal core material, at least one insulation layer disposed on the first portion, and at least one circuit pattern disposed on the at least one insulation layer;
a second routing area, distinct and separate from the first routing area, which includes a second portion of the metal core material, at least one insulation layer disposed on the second portion, and at least one circuit pattern disposed on the at least one insulation layer of the second portion; and
a connecting portion consisting of a third portion of the metal core material, said third portion interposed between the first portion and the second portion along a longitudinal length of the metal core material, said third portion including a bend, said connecting portion configured to connect the first and second routing portions to each other.

6. The metal core substrate according to claim 5, wherein the sheet of metal core material consists of one sheet layer.

7. The metal core substrate according to claim 5, wherein the third portion of the metal core material is exposed without an insulation layer formed thereon.

* * * * *